United States Patent [19]
Kamejima

[11] Patent Number: 4,759,025
[45] Date of Patent: Jul. 19, 1988

[54] WINDOW STRUCTURE SEMICONDUCTOR LASER

[75] Inventor: Taibun Kamejima, Tokyo, Japan

[73] Assignee: NEC Corporation, Tokyo, Japan

[21] Appl. No.: 901,067

[22] Filed: Aug. 26, 1986

[30] Foreign Application Priority Data

Aug. 26, 1985 [JP] Japan .................. 60-185813

[51] Int. Cl.$^4$ ............................. H01S 3/19
[52] U.S. Cl. ................... 372/46; 372/45; 357/17; 357/4
[58] Field of Search .......... 372/44, 45, 46; 357/17, 357/16, 45 L

[56] References Cited

U.S. PATENT DOCUMENTS 4,309,668  1/1982  Ueno et al. ................ 372/46
4,511,408  4/1985  Holonyak, Jr. ............ 372/45

OTHER PUBLICATIONS

IEEE Journal of Quantum Electronics, vol. QE-15, No. 8, Aug. 1979, pp. 775-781, Yonezu et al., "An AlGaAs Window Structure Laser."

Primary Examiner—James W. Davie
Assistant Examiner—Georgia Y. Epps
Attorney, Agent, or Firm—Sughrue, Mion, Zinn, Macpeak and Seas

[57] ABSTRACT

A semiconductor laser includes an active layer 3 of alternately deposited materials I, II defining a quantum well heterostructure, with an elongate window stripe portion being thermally interdiffused by laser irradiation to form a mixed crystal exciting region 8 having a band gap narrower than that of the surrounding layer, which is thus transparent to emitted light.

3 Claims, 2 Drawing Sheets

WINDOW STRUCTURE SEMICONDUCTOR LASER

BACKGROUND OF THE INVENTION

The present invention relates to a semiconductor laser and, more particularly, to a high optical output window structure semiconductor laser.

In a double heterojunction semiconductor laser, high optical power density emission was achieved with a so called window structure laser by forming a stripe-geometry exciting region in an active layer so as not to be exposed on the opposite reflective surfaces, and selecting a band gap of the stripe-geometry exciting region narrower than that of a pair of window regions or non-exciting regions formed between the respective reflective end surfaces and the tip ends of the exciting region. To make the band gap of the exciting region narrower than that of the window regions, a corresponding region of the heavily doped n-type active layer is changed into a p-type region by diffusing a p-type impurity such as zinc (see IEEE Journal of Quantum Electronics, vol. IE-IJ, No. 8, August 1979, pp. 775 to 781). This semiconductor laser, however, requires very fine and delicate control of the concentration and depth of the p-type impurity diffused region formed in the active layer, and that it has heretofore been difficult to obtain reproducibility with a good yield. In addition, since an impurity is heavily doped into the active layer a lattice defect is easily induced, which means that the reliability of the semiconductor laser of the type described above is unsatisfactory.

SUMMARY OF THE INVENTION

It is therefore an object of the present invention to provide a semiconductor laser having a novel window structure which can be produced with a good yield.

According to the present invention, a pair of window regions in an active layer comprises a multilayer quantum well structure and an exciting region comprises a semiconductor layer of combined composition of the multilayer quantum well heterostructure. As is well known, a multilayer quantum well structure having a layer thickness on the order of the de Broglie wavelength of electrons has an effective band gap wider than a mean value of band gaps $Eg_1$ and $Eg_2$ of alternatingly stacked dual semiconductor layers forming the multilayer quantum well heterostructure.

In the semiconductor laser of the present invention, therefore, the end facet regions in the active layer become transparent to the light emitted from the multilayer quantum well structure.

DESCRIPTION OF THE PREFERRED EMBODIMENT

Figure 1:
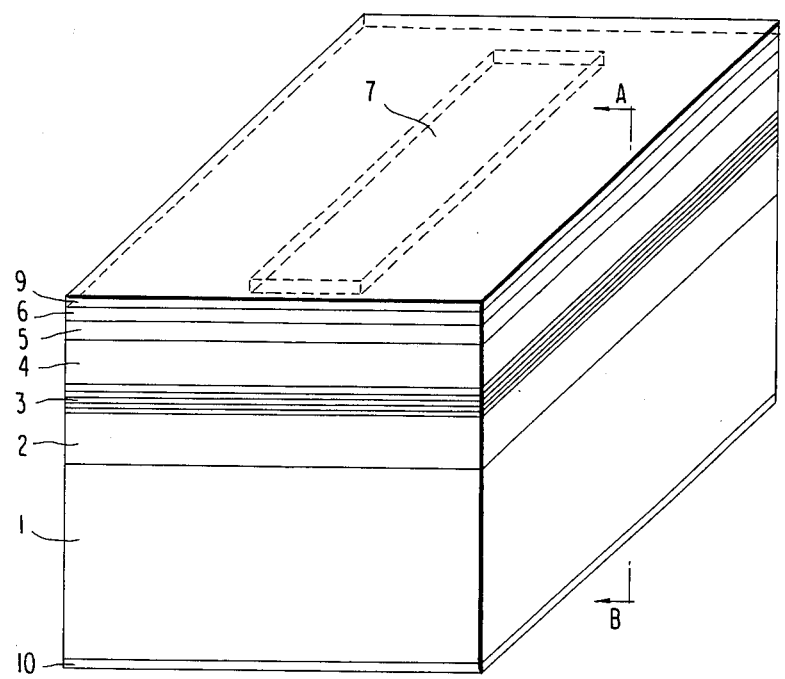
FIG. 1 is a perspective view of one embodiment of a semiconductor laser according to the present invention.
Figure 2:
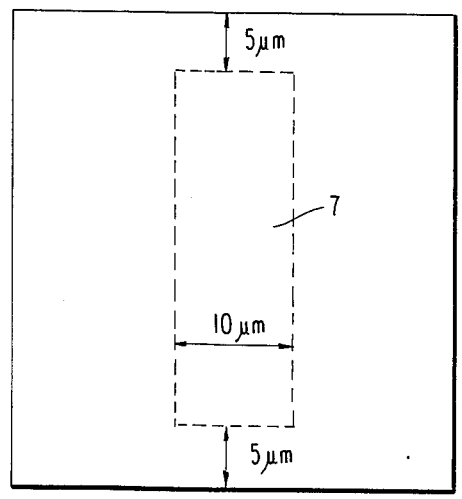
FIG. 2 is a plan view of the semiconductor laser shown in FIG. 1.
Figure 3:
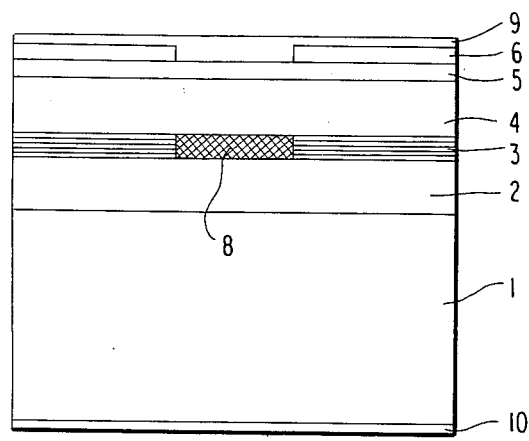
FIG. 3 is a sectional view of the semiconductor laser taken along the line A-B in FIG. 1.

The structure of one embodiment of the present invention will be described hereinafter with reference to FIGS. 1 to 3.

An n-type $Al_{0.1}Ga_{0.7}As$ first cladding layer 2 of about 3 μm thickness is grown on an n-type GaAs substrate 1, and an active layer 3 is then grown on the layer 2. Initially, the active layer 3 has a multilayer quantum well heterostructure which consists of a layer I of GaAs (the band gap $Eg_1 = 1.4$ eV) and a layer II of $Al_{0.1}Ga_{0.9}As$ (the band gap $Eg_2 = 1.5$ eV). Each of the GaAs and the $Al_{0.1}Ga_{0.9}As$ layers has a thickness of 50 Å, and these layers are deposited alternately in 15 cycles, the overall thickness of the active layer 3 is thus 1500 Å. Such thickness may be determined so as to achieve a maximum confinement factor as in the case of conventional double heterojunction lasers. No doping is carried out into the active layer 3. Further, a p-type $Al_{0.3}Ga_{0.7}As$ second cladding layer 4 is grown to a thickness of about 3 μm, and a $p^+$-type $Al_{0.1}Ga_{0.9}As$ cap layer 5 for an ohmic contact is grown to a thickness of about 0.5 μm. These crystal growth steps are carried out by the MBE (Molecular Beam Epitoxy) method.

The following is a description of a method of obtaining an exciting region having a band gap narrower than that of the end facet regions or window regions in the active layer 3.

An $SiO_2$ film 6 with a stripe opening 7 for current confinement is provided on the $p^+$-type $Al_{0.1}Ga_{0.9}As$ cap layer 5. In a window structure laser, it is known to space apart the tip ends of an exciting region from the end facets by a distance at least equal to the diffusion length of carriers. For this reason, the end portions of the opening 7 are separated from each of the cleavage end facets by 5 μm. The width of the opening 7 is not restricted to a certain value; the illustrated embodiment it is 10 μm.

Through this opening 7, a converged laser beam of 1.4 eV energy is irradiated by means of a high-output dye laser. A GaAs/AlGaAs high-output semiconductor laser may also be employed. The energy of the laser beam entering through the opening 7 is selected such that the irradiated laser beam is absorbed in the quantum well layers but is not absorbed in the ohmic contact layer 5 and the second cladding layer 4. That is, the energy of the irradiated beam should be narrower than the band gaps of these layers 5 and 4, but equal to or wider than that of at least one of the quantum well layers I and II. The absorbed thermal energy causes interdiffusion between the layers I and II in the quantum well structure, and this structure is gradually broken down. As the quantum well structure is broken the effective band gap becomes narrower and it thus becomes easier for the irradiated beam to be absorbed, which means that the interdiffusion progresses further. In this way the irradiated region alone in the active layer 3 finally becomes a uniform mixed crystal 8 of $Al_{0.05}Ga_{0.95}As$, as shown in FIG. 3. Although the $SiO_2$ film 6 cannot be used as a mask for the irradiation beam, its opening 7 facilitates the positioning of the beam.

The mixed crystal region corresponds to the opening 7, and constitutes a current restriction region (current injection region). Its band gap is equal to the mean value $Eg = 1.45$ eV. On the other hand, the surrounding non-exciting region which has not been irradiated with the laser beam has an effective band gap of $Eg = 1.47$ eV due to the quantum size effect characteristic of the quantum well structure, and therefore serves as a transparent window with respect to the oscillated light.

Each quantum well layer may have a thickness in the range of about 40 Å to 100 Å. The thinner each layer, the wider the effective band gap of the quantum well structure. Band gap difference between the exciting region and the window region can thus be increased by reducing the thickness of each quantum well layer. It is preferable that the band gap difference bewider than 10 meV.

After the above-described treatment, a p-type ohmic electrode 9, such as Au-Zn alloy is provided on the cap layer 5 through the opening 7, and an n-type ohmic electrode 10 such as Au-Ge alloy is provided on the substrate side. The wafer thus formed is cleaved to produce a semiconductor laser having mirror surfaces defined by the crystal end facets. Such laser exhibits no optical damage even when the optical outputs exceeds 100 mW (the optical output density: 7 MW/cm$^2$). Since the side regions implement a buried double heterojunction function with a relatively small barrier, it is possible to readily obtain a semi-conductor laser whose CW oscillation threshold at room temperature is 100 mA or less.

As has been detailed above, it is possible, according to the present invention, to provide a high optical output semiconductor laser which can be produced at good yields, since, unlike the conventional window structure laser, the semiconductor laser of the invention requires no delicate control in manufacture.

While the invention has been described with respect to an AlGaAs-GaAs double heterojunction laser, the invention is equally applicable to various crystal materials such as InGaAsP-InP and GaAsSbAl-GaAsSb.

What is claimed is:

1. A window structure semiconductor laser, comprising a semiconductor crystal having spaced, substantially parallel, upper and lower surfaces and optically reflective first and second end surfaces constituting an optical resonator therebetween, and a pair of electrodes (9, 10), said semiconductor crystal including an active layer formed in said crystal and flanked on opposite ends thereof by said first and second end surfaces, said active layer having an exciting region buried within said crystal and elongated between said first and second end surfaces, upper and lower interfaces of said exciting region with said crystal forming heterojunctions, respectively, said pair of electrodes being individually provided on said upper and lower surfaces so as to supply injection current to said exciting region to emit a light, said active layer further having first and second non-exciting regions at opposite ends of said exciting region, said first non-exciting region extending from one end of said exciting region to said first end surface and said second non-exciting region extending from another, opposite end of said exciting region to said second end surface, said non-exciting regions comprising a series (3) of very thin heterostructure layers of alternating materials (I, II) having different band gaps to form a multilayer quantum well heterostructure, said exciting region comprising a single layer of material (8) of a mixed composition of said alternating materials and having a band gap narrower than that of said non-exciting regions such that said non-exciting regions are transparent to said light emitted from said exciting region.

2. A stripe geometry window structure semiconductor laser, comprising: a heterojunction structure including a first semiconductor layer sandwiched between second and third semiconductor layers, said second and third semiconductor layers having a wider band gap than that of said first semiconductor layer, said first semiconductor layer having an elongated exciting region with opposite ends thereof disposed between a pair of end facets of the laser in a stripe geometry, said end facets comprising an optical resonator, said first layer further having non-exciting regions located between one of said opposite ends of said exciting region and one of said end facets of the laser and between another of said opposite ends of said exciting region and another of said end facets of the laser, said non-exciting regions comprising multilayer alternate semiconductor layers (I, II) having different band gaps to form a multilayer quantum well heterostructure, said exciting region comprising a single layer of material (8) having a band gap narrower than that of said non-exciting regions such that said non-exciting regions are transparent to said light emitted from said exciting region.

3. A semiconductor laser as claimed in claim 2, wherein said exciting region is a thermally interdiffused mixed crystal of said multilayer quantum well structure, and has a band gap equal to that of a mean value of said alternating semiconductor layers.

* * * * *